(12) United States Patent
Hong et al.

(10) Patent No.: US 8,815,016 B2
(45) Date of Patent: Aug. 26, 2014

(54) HEATING UNIT AND SUBSTRATE PROCESSING APPARATUS HAVING THE SAME

(75) Inventors: Jong-Won Hong, Yongin (KR); Min-Jae Jeong, Yongin (KR); Heung-Yeol Na, Yongin (KR); Eu-Gene Kang, Yongin (KR); Seok-Rak Chang, Yongin (KR)

(73) Assignee: Samsung Display Co., Ltd., Yongin (KR)

( * ) Notice: Subject to any disclaimer, the term of this patent is extended or adjusted under 35 U.S.C. 154(b) by 847 days.

(21) Appl. No.: 12/857,723

(22) Filed: Aug. 17, 2010

(65) Prior Publication Data

US 2011/0107970 A1 May 12, 2011

(30) Foreign Application Priority Data

Nov. 6, 2009 (KR) ........................ 10-2009-0107175

(51) Int. Cl.
*C23C 16/00* (2006.01)

(52) U.S. Cl.
USPC .. 118/724; 156/912; 156/345.37; 156/345.54

(58) Field of Classification Search
USPC .............................. 156/345.37, 912; 118/724; 422/198–208
See application file for complete search history.

(56) References Cited

U.S. PATENT DOCUMENTS

| | | | | |
|---|---|---|---|---|
| 4,357,305 A | * | 11/1982 | Loo | 422/241 |
| 5,383,984 A | * | 1/1995 | Shimada et al. | 156/345.26 |
| 5,792,261 A | * | 8/1998 | Hama et al. | 118/723 I |
| 2007/0104626 A1 | * | 5/2007 | Yonekura et al. | 422/198 |
| 2008/0187652 A1 | * | 8/2008 | Nakajima et al. | 427/96.8 |
| 2008/0289767 A1 | * | 11/2008 | Tandou et al. | 156/345.53 |
| 2012/0006356 A1 | * | 1/2012 | Kamikawa | 134/10 |

FOREIGN PATENT DOCUMENTS

| | | |
|---|---|---|
| CN | 2710024 | 7/2005 |
| JP | 2000-021797 | 1/2000 |
| JP | 2008-153505 | 7/2008 |
| JP | 2008-235853 | 10/2008 |
| KR | 10-2005-0058842 | 6/2005 |
| KR | 10-2007-0044798 | 4/2007 |
| KR | 10-2009-0080900 | 7/2009 |

OTHER PUBLICATIONS

Kim, Translation for JP20050058842A.*

* cited by examiner

*Primary Examiner* — Gordon R Baldwin
*Assistant Examiner* — Charlee Bennett
(74) *Attorney, Agent, or Firm* — H.C. Park & Associates, PLC

(57) ABSTRACT

A substrate processing apparatus includes a heating unit that heats a processing chamber that processes a plurality of substrates and that quickly cools the processing chamber after the processing. The heating unit includes a body having an intake port and an exhaust port, one or more heaters located inside the body, a cooler connected to the intake port of the body, an exhaust pump connected to the exhaust port of the body, and a controller controlling the cooler. The substrate processing apparatus includes a boat in which a plurality of substrates are stacked, a processing chamber providing a space in which the substrates are processed, a transfer unit carrying the boat into or out of the processing chamber, and the heating unit located outside the processing chamber.

20 Claims, 2 Drawing Sheets

HEATING UNIT AND SUBSTRATE PROCESSING APPARATUS HAVING THE SAME

CROSS-REFERENCE TO RELATED APPLICATION

This application claims the benefit of Korean Patent Application No. 10-2009-0107175, filed Nov. 6, 2009, in the Korean Intellectual Property Office, the disclosure of which is incorporated herein by reference.

BACKGROUND

1. Field of the Invention

An aspect of the present invention relates to a substrate processing apparatus to process a plurality of substrates, and more particularly, to a heating unit that heats a processing chamber in which a plurality of substrates are processed, and a substrate processing apparatus having the same in which the heating unit is cooled in a short time to thereby reduce a time required to cool the processing chamber.

2. Description of the Related Art

Flat panel display devices have replaced cathode ray tube display devices due to characteristics such as light weight, thin thickness, and so on. Typical examples thereof include liquid crystal display devices (LCDs) and organic light emitting diode (OLED) display devices. In comparison with LCDs, OLED display devices are excellent in brightness and viewing angle characteristics and require no backlight, so that they can be ultra thin display devices.

OLED display devices use a phenomenon in which electrons injected from a negative electrode (cathode) and holes injected from a positive electrode (anode) are recombined to create excitons in an organic thin film such that light having a specific wavelength is emitted by the release of energy resulting from de-excitation of the excitons. The OLED display devices are classified into two types, a passive matrix type and an active matrix type, according to the driving method. Active matrix type OLED display devices include a circuit using a thin film transistor (TFT).

These flat panel display devices are manufactured by forming a thin film having electrical properties on a substrate in a predetermined pattern using an organic or inorganic compound, and then heat-treating the formed thin film. The process of forming the thin film is generally divided into physical vapor deposition (PVD) processes such as a sputtering process of applying plasma to a target and depositing a thin film on a substrate, and chemical vapor deposition (CVD) processes such as an atomic layer deposition (ALD) process of spraying a reaction gas containing a source material on a substrate and forming an atomic layer of the source material on the substrate through a chemical reaction.

The CVD processes have higher uniformity and step coverage of the thin film, and allow a plurality of substrates to be processed at one time, compared to the PVD processes, and thus are widely used in processes of forming an amorphous silicon layer and an insulating layer such as a nitride layer or an oxide layer.

Typically, to simultaneously form a thin film on a plurality of substrates using a CVD process or perform heat treatment on the thin films, a substrate processing apparatus includes a boat on which the substrates are stacked, a processing chamber providing a space in which the substrates can be processed, a transfer unit carrying the boat into or out of the processing chamber, and a heating unit located outside the processing chamber. The transfer unit may include a heat insulating section such that the processing chamber can be readily heated therein by the heating unit.

This substrate processing apparatus is designed to directly introduce external air into the processing chamber or allow the external air to flow between the processing chamber and the heating unit, after the substrates stacked on the boat are completely processed. In the case where the external air is directly introduced into the processing chamber, it is possible to cool the processing chamber in a short time, but there is a possibility of impurities being deposited on the substrates stacked on the boat. Further, in the case where the external air flows between the processing chamber and the heating unit, a time required to cool the processing chamber is increased due to heat of the heating unit, and thus an overall processing time is increased.

SUMMARY OF THE INVENTION

Aspects of the present invention provide a heating unit and a substrate processing apparatus having the same, in which the heating unit is rapidly cooled in a short time after a processing process to reduce a time required to cool the processing chamber, thereby making it possible to reduce an entire processing time.

According to an exemplary embodiment of the present invention, a heating unit includes a body having an intake port and an exhaust port, one or more heaters located inside the body, a cooler connected to the intake port of the body, an exhaust pump connected to the exhaust port of the body, and a controller controlling the cooler.

According to another exemplary embodiment of the present invention, a substrate processing apparatus includes a boat in which a plurality of substrates are stacked, a processing chamber providing a space in which the substrates are processed, a transfer unit carrying the boat into or out of the processing chamber, and a heating unit located outside the processing chamber and includes a body having an intake port and an exhaust port, one or more heaters located inside the body, a cooler connected to the intake port of the body, an exhaust pump connected to the exhaust port of the body, and a controller controlling the cooler.

According to another exemplary embodiment of the present invention, a heating unit that controls a temperature of a processing chamber comprises a body that surrounds a portion of the processing chamber; one or more heaters located inside the body; a cooling passage located inside the body; an intake port and an outtake port connected to the cooling passage; a cooler connected to the intake port of the body; an exhaust pump connected to the exhaust port of the body; and a controller that controls the cooler to cool the processing chamber after the processing chamber has been heated by the one or more heaters.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION

Figure 1:
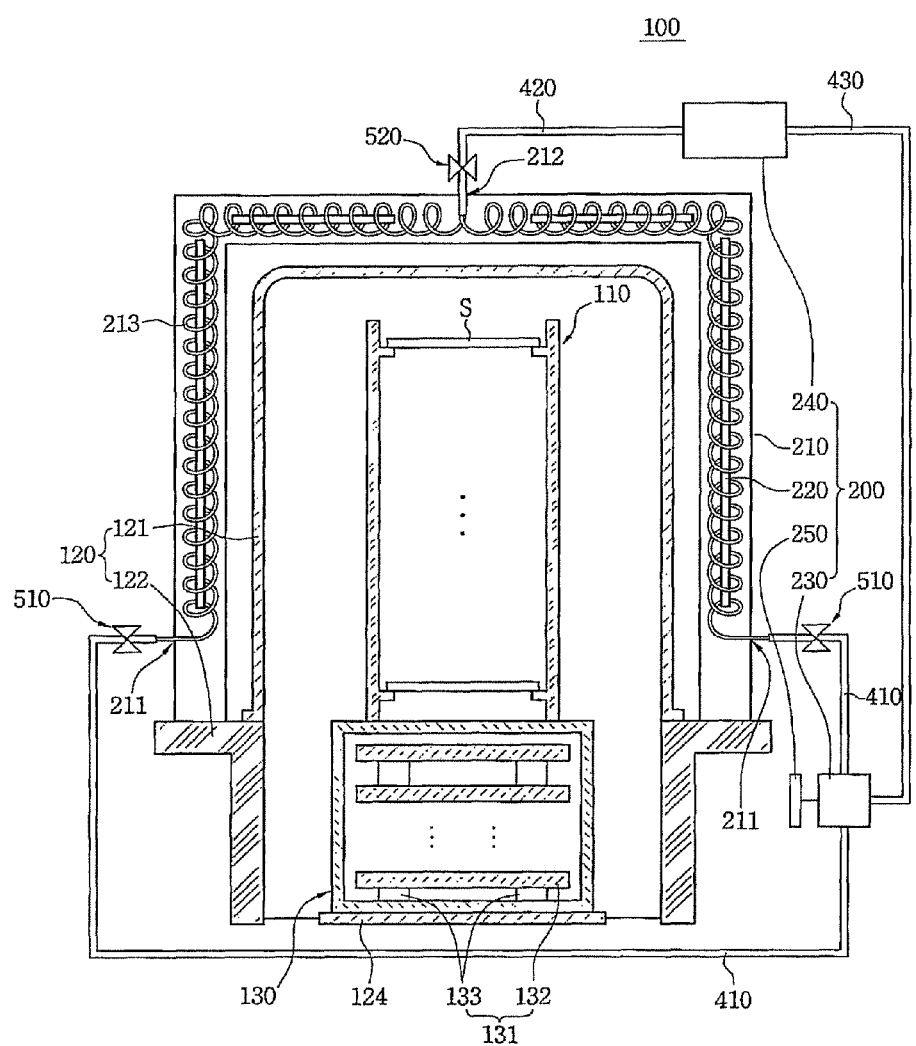
FIG. 1 schematically illustrates a substrate processing apparatus according to an exemplary embodiment of the present invention.

Reference will now be made in detail to the present embodiments of the present invention, examples of which are illustrated in the accompanying drawings, wherein like reference numerals refer to the like elements throughout. The embodiments are described below in order to explain aspects of the present invention by referring to the figures.

Figure 2:
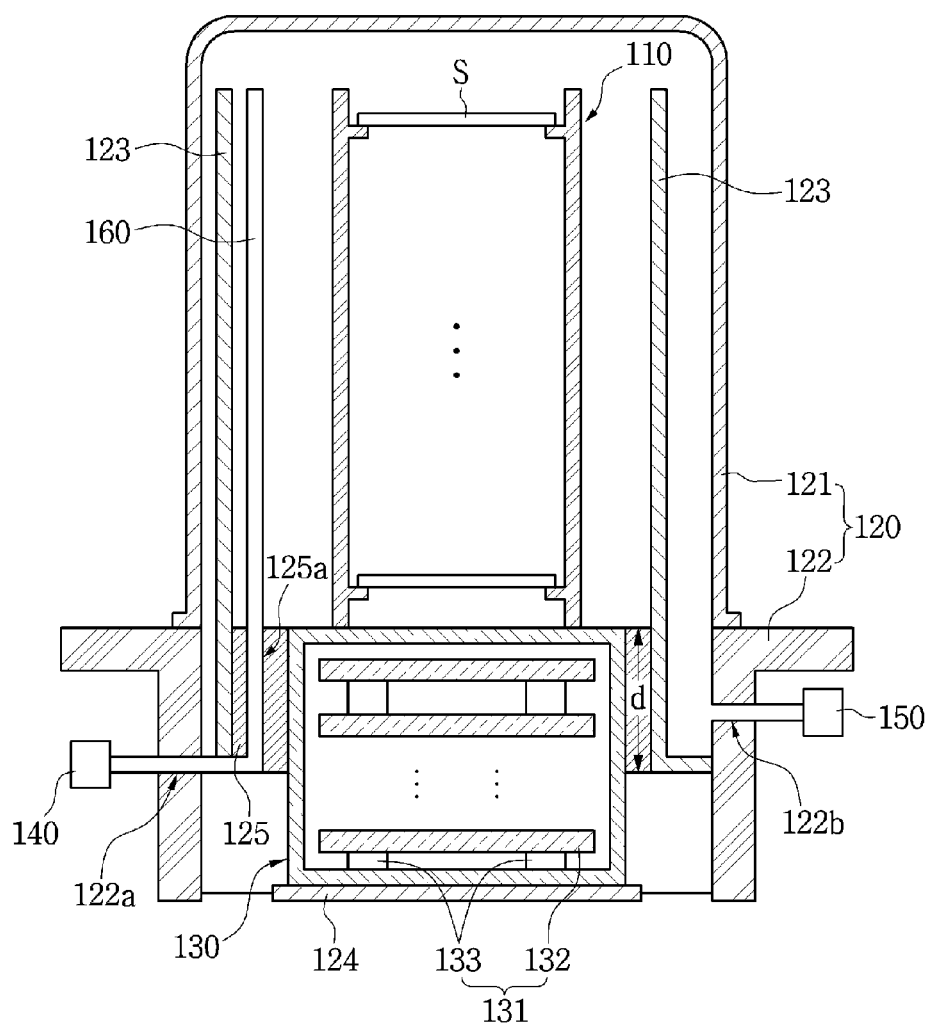
FIG. 2 schematically illustrates the interior of a processing chamber in a substrate processing apparatus according to an exemplary embodiment of the present invention.

FIG. 1 schematically illustrates a substrate processing apparatus according to an exemplary embodiment of the present invention. FIG. 2 schematically illustrates the interior of a processing chamber in a substrate processing apparatus according to an exemplary embodiment of the present invention.

Referring to FIGS. 1 and 2, a substrate processing apparatus 100 according to an exemplary embodiment of the present invention includes a boat 110 in which a plurality of substrates S are stacked, a processing chamber 120 providing a space in which the substrates are processed, a transfer unit 130 carrying the boat 110 into or out of the processing chamber 120, and a heating unit 200 located outside the processing chamber 120.

The boat 110 is designed such that the substrates S can be stacked in a vertical direction. Although not illustrated, the boat 110 may further include a substrate holder (not shown) that clamps each substrate S to prevent the substrates S from being damaged while being carried by the transfer unit 130. In this embodiment, the boat 110 has been described as being formed such that the substrates S can be vertically stacked. Alternatively, the boat 110 may be designed such that the substrates S can be arranged in a horizontal direction.

The processing chamber 120 simultaneously processes the substrates S stacked in the boat 110, and includes a first tube 121 preventing the substrates S stacked in the boat 110 from coming into contact with external air during processing of the substrates and a manifold 122 located under the first tube 121 and into and out of which the boat 110 having the stacked substrates S is carried. Here, the manifold 122 may be provided with a shutter 124 at a lower portion thereof, which can move in a horizontal direction such that the processing chamber 120 can be sealed after the boat 110 is carried into the processing chamber 120.

Further, the manifold 122 may include an inflow port 122a connected with a reaction gas supply unit 140 in which a reaction gas is stored and causes the reaction gas to flow into the processing chamber 120 such that a thin film can be simultaneously formed on the substrates S stacked in the boat 110 in the processing chamber 120, and an outflow port 122b that discharges a non-reactive gas that does not react with the substrates. The outflow port 122b of the manifold 122 may be connected with a vacuum pump 150 maintaining the interior of the processing chamber 120 in a vacuum state such that the non-reactive gas can be smoothly discharged.

The transfer unit 130 carries the boat 110 into and out of the processing chamber 120 through the lower portion of the manifold 122, and may include a heat insulator 131 so as to reduce a loss of heat of the boat 110 heated by the heating unit 200. Here, the heat insulator 131 may be configured of a single heat insulation plate 132. Preferably, the heat insulator 131 includes a plurality of heat insulation plates 132 and heat insulation plate holders 133 supporting the heat insulation plates 132 in order to minimize the heat loss of the boat 110.

Further, the substrate processing apparatus 100 may further include a second tube 123 interposed between the first tube 121 of the processing chamber 120 and the boat 110 and a third tube 125 interposed between the second tube 123 and the transfer unit 130 in order to minimize the heat loss of the boat 110. Preferably, a length d of the third tube 125 is equal to a length by which the second tube 123 overlaps the transfer unit 130.

Here, in the case where the inflow port 122a of the manifold 122 is located on the side of the shutter 124 of the manifold 122 rather than the third tube 125, the third tube 125 may be provided with a hole 125a through which a gas spray unit 160 connected with the inflow port 122a passes. The gas spray unit 160 may extend up to an upper end of the boat 110 in a direction where the substrates S are stacked in the boat 110, and may be provided with spray holes all around such that the reaction gas is uniformly sprayed onto the substrates S stacked in the boat 110.

The heating unit 200 is located outside the processing chamber 120, and heats the processing chamber 120 as well as the boat 110 during processing of the substrates S. To this end, the heating unit 200 includes a body 210 having an intake port 211 and an exhaust port 212, one or more heaters 220 located inside the body 210, a cooler 230 connected to the intake port 211 of the body 210, an exhaust pump 240 connected to the exhaust port 212 of the body 210, and a controller 250 controlling the cooler 230.

The body 210 houses the one or more heaters 220, and serves as a flow passage of air to forcibly cool the one or more heaters 220 after the process of processing the one or more substrates S is completed. To efficiently cool the one or more heaters 220, the body 210 may be provided with a cooling passage 213 connecting the intake and exhaust ports 211 and 212 thereof. To more efficiently cool the one or more heaters 220, the cooling passage 213 preferably surrounds the one or more heaters 220 in a spiral shape.

The cooler 230 causes cold air to flow into the body 210 after the processing process, and thus forcibly cools the one or more heaters 220 located inside the body 210. The exhaust pump 240 discharges the air that is introduced into the body 210 by the cooler 230 and the cooler 230 rapidly cools the one or more heaters 220.

Here, the heating unit 200 may prevent the air from flowing into and out of the body 210 during the processing using a first valve 510 installed on a first pipe 410 connecting the intake port 211 of the body 210 and the cooler 230 and a second valve 520 installed on a second pipe 420 connecting the exhaust port 212 of the body 210 and the exhaust pump 240, in order to prevent processing conditions of the processing chamber 210 from being changed by a flow of the air flowing through the interior of the body 210.

Further, the heating unit 200 according to an exemplary embodiment of the present invention has been described as providing the intake port 211 to a sidewall of the body 210 and the exhaust port 212 to an upper portion of the body 210. Alternatively, the intake and exhaust ports 211 and 212 may be located on opposite sidewalls of the body 210. Further, the cooler 230 and the exhaust pump 240 may be connected by a third pipe 430, and the air to forcibly cool the one or more heaters 220 may circulate through the body 210, the cooler 230, and the exhaust pump 240.

The controller 250 controls the cooler 230, thereby controlling the cooling of the air flowing into the body 210 as well as a temperature of the body 210, and may include a temperature sensor (not shown) to measure the temperature of the body 210.

Consequently, the substrate processing apparatus according to an exemplary embodiment of the present invention introduces the cold air into the body of the heating unit housing the one or more heaters to forcibly cool the one or more heaters, thereby reducing a time required to cool the processing chamber after the processing process.

Thus, a substrate processing apparatus according to an exemplary embodiment of the present invention is configured to force cold air to circulate through an interior of the body of a heating unit after a processing process is completed, thereby forcibly cooling the one or more heaters located inside the body. As a result, the substrate processing apparatus can reduce a time required to cool a processing chamber and thereby shorten the entire processing time.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A heating unit, comprising:
a body comprising an intake port and an exhaust port;
at least one heater located inside the body;
a cooler connected to the intake port of the body;
a cooling passage located between an inner wall of the body and an outer wall of the body, the cooling passage connecting the intake port to the exhaust port and having a spiral shape, the at least one heater being a central axis of the spiral cooling passage;
an exhaust pump connected to the exhaust port of the body;
a controller configured to control the cooler; and
a first valve installed on a first pipe and connecting the intake port of the body and the cooler, the intake port being configured to receive a coolant from the cooler via the first valve.

2. The heating unit according to claim 1, further comprising:
a second valve installed on a second pipe and connecting the exhaust port of the body and the exhaust pump, the exhaust port being configured to discharge the coolant from the body to the exhaust pump via the second valve.

3. The heating unit according to claim 1, wherein the controller comprises a temperature sensor configured to measure a temperature of the body.

4. The heating unit according to claim 1, wherein the cooling passage completely encircles the at least one heater.

5. The heating unit according to claim 4, wherein:
the cooler is directly connected to the controller and the exhaust pump.

6. The heating unit according to claim 1, further comprising a third pipe connecting the exhaust pump to the cooler, the third pipe being configured to provide a passage for an exhaust flow from the exhaust pump to the cooler.

7. A substrate processing apparatus, comprising:
a boat configured to stack a plurality of substrates;
a processing chamber configured to provide a space for processing the substrates;
a transfer unit configured to control movement of the boat in and out of the processing chamber; and
a heating unit located outside the processing chamber and positioned to control a temperature of the processing chamber,
wherein the heating unit comprises:
a body comprising an intake port and an exhaust port;
at least one heater located inside the body;
a cooler connected to the intake port of the body;
a cooling passage located between an inner wall of the body and an outer wall of the body, the cooling passage connecting the intake port to the exhaust port and having a spiral shape, the at least one heater being a central axis of the spiral cooling passage;
an exhaust pump connected to the exhaust port of the body;
a controller configured to control the cooler; and
a first valve installed on a first pipe and connecting the intake port of the body and the cooler.

8. The substrate processing apparatus according to claim 7, wherein the heating unit further comprises:
a second valve installed on a second pipe and connecting the exhaust port of the body and the exhaust pump.

9. The substrate processing apparatus according to claim 7, wherein the controller comprises a temperature sensor configured to measure a temperature of the body.

10. The substrate processing apparatus according to claim 7, wherein the cooling passage completely encircles the at least one heater.

11. The substrate processing apparatus according to claim 10, wherein the cooler is directly connected to the controller and the exhaust pump.

12. The substrate processing apparatus according to claim 7, wherein the heating unit further comprises a third pipe connecting the exhaust pump to the cooler, the third pipe being configured to provide a passage for an exhaust flow from the exhaust pump to the cooler.

13. The substrate processing apparatus according to claim 7, wherein the transfer unit comprises a heat insulator.

14. The substrate processing apparatus according to claim 13, wherein the heat insulator comprises at least one heat insulation plate and heat insulation plate holders configured to support the at least one heat insulation plate.

15. The substrate processing apparatus according to claim 7, wherein the processing chamber comprises a manifold having an inflow port and an outflow port, and a first tube disposed on the manifold.

16. The substrate processing apparatus according to claim 15, further comprising a gas supply unit configured to provide a reaction gas supplied through the inflow port onto the substrates stacked in the boat.

17. The substrate processing apparatus according to claim 15, further comprising a vacuum pump connected to the outflow port to maintain a vacuum state in the processing chamber.

18. The substrate processing apparatus according to claim 15, further comprising a second tube interposed between the first tube and the boat, and a third tube interposed between the second tube and the transfer unit, the third tube comprising a hole.

19. The substrate processing apparatus according to claim 18, wherein:
the second tube overlaps a portion of the transfer unit and extends into the processing chamber; and
the third tube has the same length as a region where the second tube overlaps the transfer unit.

20. A heating unit, comprising:
a body surrounding a portion of a processing chamber;
at least one heater located inside the body;
a cooling passage between an inner wall of the body and an outer wall of the body and having a spiral shape, the at least one heater being a central axis of the spiral cooling passage;
an intake port and an exhaust port connected to the cooling passage;
a cooler connected to the intake port of the body;

an exhaust pump connected to the exhaust port of the body;
a controller configured to control the cooler to cool the processing chamber after the processing chamber is heated by the at least one heater; and
a first valve installed on a first pipe and connecting the intake port and the cooler, the intake port being configured to receive a coolant from the cooler via the first valve.

* * * * *